US012638536B2

(12) United States Patent
Mueller-Remer et al.

(10) Patent No.: US 12,638,536 B2
(45) Date of Patent: May 26, 2026

(54) TEST AND/OR MEASUREMENT INSTRUMENT AND CALIBRATION METHOD

(71) Applicant: Rohde & Schwarz GmbH & Co. KG, Munich (DE)

(72) Inventors: Daniel Mueller-Remer, Munich (DE); Ulrich Tuerk, Munich (DE); Tobias Koller, Munich (DE); Florian Galler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 123 days.

(21) Appl. No.: 18/616,860

(22) Filed: Mar. 26, 2024

(65) Prior Publication Data

US 2025/0306155 A1     Oct. 2, 2025

(51) Int. Cl.
*G01R 35/00*     (2006.01)
*G01R 31/28*     (2006.01)

(52) U.S. Cl.
CPC ....... *G01R 35/005* (2013.01); *G01R 31/2834* (2013.01)

(58) Field of Classification Search
None
See application file for complete search history.

(56) References Cited

U.S. PATENT DOCUMENTS

| | | | |
|---|---|---|---|
| 7,030,625 B1* | 4/2006 | Boudiaf | G01R 35/005 |
| | | | 324/638 |
| 11,506,694 B1 | 11/2022 | Fastner et al. | |

| | | | |
|---|---|---|---|
| 11,892,534 B2* | 2/2024 | Hamachi | G01R 23/02 |
| 2018/0302179 A1* | 10/2018 | Leibfritz | G01R 27/32 |
| 2024/0085348 A1* | 3/2024 | Iida | G01N 22/04 |
| 2025/0244435 A1* | 7/2025 | Ramian | G01R 35/005 |
| 2025/0271492 A1* | 8/2025 | Ramian | G01R 27/28 |

OTHER PUBLICATIONS

Zhiyuan, Z. and G. Yongrui, "New calibration of simplifying through connections on multiport VNA," The 41st Research Institute of CETC, Qingdao, China,2015 IEEE 12th International Conference on Electronic Measurement & Instruments; pp. 447-450.

* cited by examiner

*Primary Examiner* — Richard Isla

(74) *Attorney, Agent, or Firm* — CHRISTENSEN O'CONNOR JOHNSON KINDNESS PLLC

(57)     ABSTRACT

A test and/or measurement instrument includes at least three ports and at least three measurement circuits connected to the at least three ports, respectively. The test and/or measurement instrument further includes at least one signal generator circuit and a control circuit. The control circuit is configured to set a first calibration mode and carry out a first test of the instrument by measuring the calibration signal travelling from the signal generator circuit to the respective port as well as a signal traveling from the respective port to the signal generator circuit. The control circuit is configured to set a second calibration mode and carry out a second test of the instrument by measuring the calibration signal forwarded only to the main port in the first sub-mode and the calibration signal received by the respective port from the signal generator circuit via the main port in the first sub-mode.

22 Claims, 6 Drawing Sheets

Fig. 3

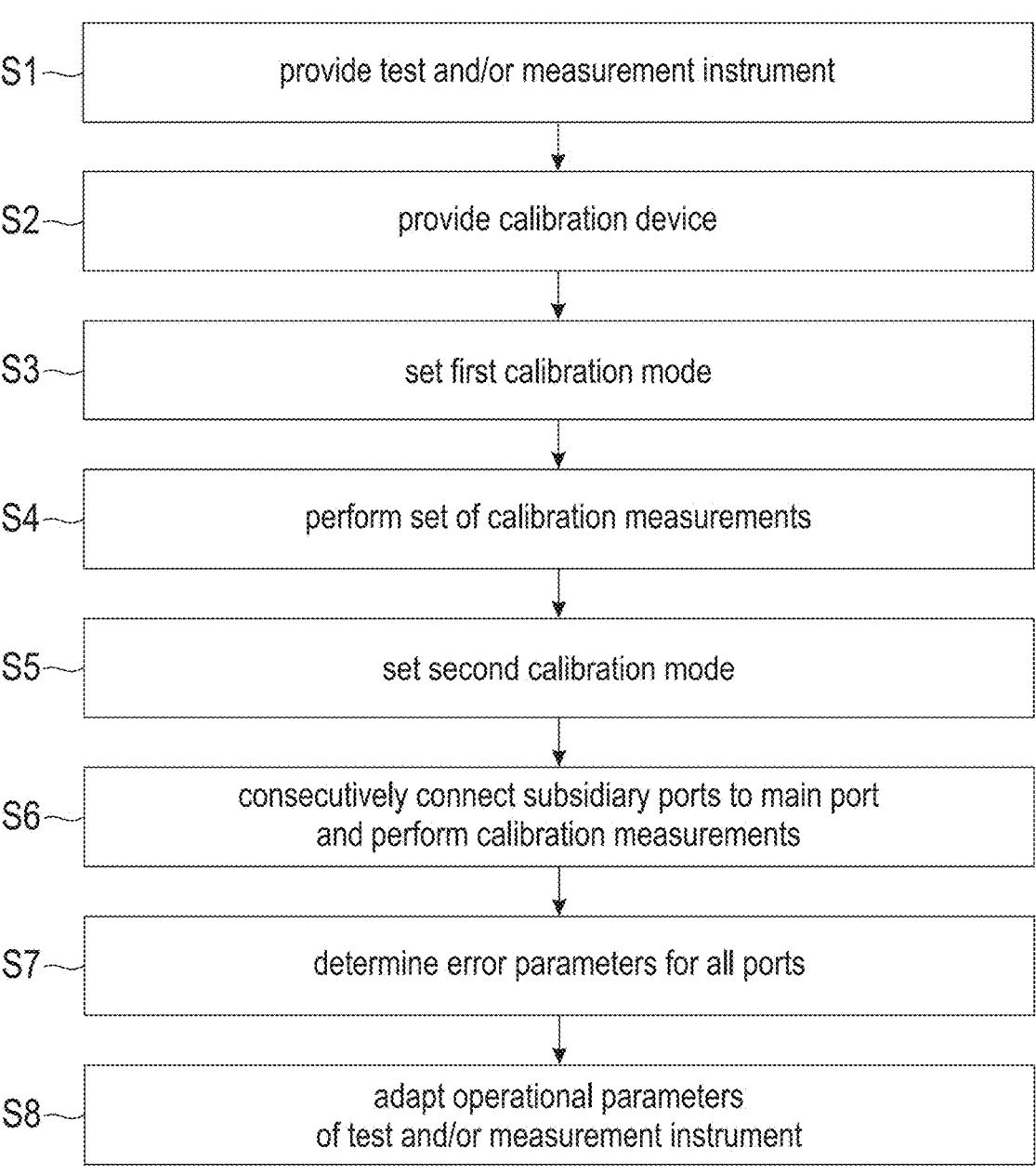

S1 — provide test and/or measurement instrument

S2 — provide calibration device

S3 — set first calibration mode

S4 — perform set of calibration measurements

S5 — set second calibration mode

S6 — consecutively connect subsidiary ports to main port
and perform calibration measurements S7 — determine error parameters for all ports S8 — adapt operational parameters
of test and/or measurement instrument Fig. 8
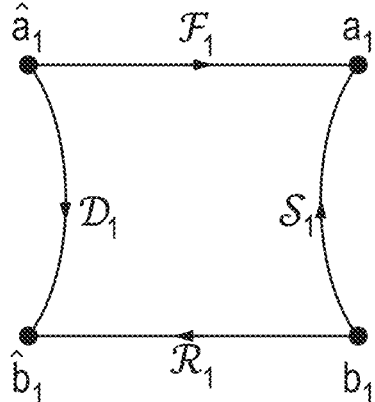
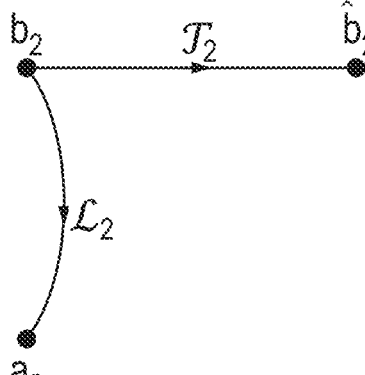

TEST AND/OR MEASUREMENT INSTRUMENT AND CALIBRATION METHOD

FIELD OF THE DISCLOSURE

Embodiments of the present disclosure generally relate to a test and/or measurement instrument. Embodiments of the present disclosure further relate to a calibration method of calibrating a test and/or measurement instrument.

BACKGROUND

In order to perform accurate measurements on a device under test, the test setup comprising a test and/or measurement instrument has to be calibrated, thereby ensuring a maximum accuracy of the measurements conducted.

For example, one calibration technique known in the state of the art is a so-called OSM-calibration, wherein three different calibration standards ("open", "short", and "matched") are consecutively connected to the test instrument and corresponding reflection measurements are performed, respectively. The OSM-calibration is also known as SOL-calibration ("short", "open", "load").

If the test and/or measurement instrument comprises more than one port that is to be connected to the device under test, additional relative measurements between the ports have to be performed, for example by adding a "through" calibration measurement (TOSM-method) or an "unknown" calibration measurement (UOSM-method). The TOSM-method is also known as SOLT-method ("short", "open", "load", "through").

To fully characterize a test and/or measurement instrument, the relative measurements have to be performed for each pair of ports. Thus, the number of measurements necessary grows rapidly with the number of ports.

The object of the present disclosure is to provide a calibration method and a test and/or measurement instrument that allow for a full characterization of each port with a reduced number of measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and/or measurement instrument. In an embodiment, the test and/or measurement instrument comprises at least three ports, wherein each of the at least three ports is configured to be connected to an external electronic device. The test and/or measurement instrument also comprises at least three measurement circuits, wherein each of the at least three measurement circuits is connected with one of the at least three ports, respectively. The test and/or measurement instrument further comprises at least one signal generator circuit, wherein the at least one signal generator circuit is configured to generate a calibration signal.

In an embodiment, the test and/or measurement instrument further comprises a control circuit. The control circuit is configured to set a first calibration mode of the test and/or measurement instrument, wherein the at least one signal generator circuit is configured to generate the calibration signal and to forward the calibration signal to the at least three ports simultaneously or consecutively in the first calibration mode. The measurement circuits are each configured to measure the calibration signal travelling from the signal generator circuit to the respective port as well as a signal traveling from the respective port to the signal generator circuit in the first calibration mode, thereby obtaining a first set of measurement data.

The control circuit is configured to set a second calibration mode of the test and/or measurement instrument, wherein one of the at least three ports is a main port, wherein the remaining ports are subsidiary ports in the second calibration mode, and wherein the second calibration mode has a first sub-mode and a second sub-mode. The at least one signal generator circuit is configured to generate the calibration signal and to forward the calibration signal only to the main port in the first sub-mode. The measurement circuits connected with the subsidiary ports are configured to measure the calibration signal received by the respective port from the signal generator circuit via the main port in the first sub-mode. The at least one signal generator circuit is configured to generate the calibration signal and to forward the calibration signal to only one of the subsidiary ports in the second sub-mode, wherein the measurement circuit connected with the main port is configured to measure the calibration signal received by the main port from the signal generator circuit via the subsidiary port in the second sub-mode, thereby obtaining a second set of measurement data.

The test and/or measurement instrument is based on the finding that the number of measurements necessary in order to calibrate the test and/or measurement instrument can be reduced significantly by employing two different calibration modes.

In the first calibration mode, measurements are performed on each port individually as well as only on selected pairs of ports, thereby obtaining the first set of measurement data. These measurements may be performed analogously to calibration techniques such as the TOSM-calibration technique, or the UOSM-calibration technique known in the state of the art.

In the second calibration mode, one of the at least three ports is designated as main port, while the remaining ports are designated as subsidiary ports. Instead of connecting all possible pairs of ports with each other and performing calibration measurements for each possible pair, measurements need only be performed for each subsidiary port connected to the main port in the second calibration mode.

For example, in the first sub-mode of the second calibration mode, a corresponding measurement is performed for each subsidiary port connected to the main port, wherein the main port is the driving port and the subsidiary ports are the receiving port, respectively. In the second sub-mode, only one measurement may be performed for one of the subsidiary ports being the driving port and the main port being the receiving port.

In other words, instead of connecting all possible pairs of ports with each other, a series of pairwise connections between the ports is chosen that allow to relate the calibration results of each port with each other port.

For test and/or measurement instruments comprising three or more ports, the number of necessary calibration measurements can be reduced significantly. In an embodiment, the larger the number of ports, the more calibration measurements can be saved by the test and/or measurement instrument according to the present disclosure.

According to an embodiment of the present disclosure, the control circuit is configured to determine error parameters for all of the at least three ports based on the first set of measurement data and based on the second set of measurement data. In an embodiment, all error parameters necessary for fully calibrating the test and/or measurement instrument can be determined based on the first set of measurement data and based on the second set of measurement data, i.e. no further measurements are necessary.

Therein and in the following, the term "error parameter" is understood to denote parameters of an error model describing transmissivity, reflectivity, directivity, source matching, and/or load matching properties of a portion of a measurement setup including the respective port(s).

According to an aspect of the present disclosure, the control circuit is configured, for example, to adapt operational parameters of the test and/or measurement instrument based on the error parameters determined. Thus, the control circuit may calibrate the test and/or measurement instrument based on the error parameters determined.

In an embodiment of the present disclosure, the control circuit is configured to determine relative power levels of driving ports and/or driving port error parameters based on the first set of measurement data. It has turned out that determining the relative power levels of the driving ports allows to resolve a dependency of receiving port error parameters on the driving port error parameters.

According to an aspect of the present disclosure, the control circuit is configured, for example, to determine error parameters for all of the at least three ports based on the first set of measurement data and based on the second set of measurement data, wherein the control circuit is configured to apply the relative power levels determined to the error parameters. In an embodiment, the control circuit may be configured to multiply receiving port error parameters determined with the relative power levels determined, thereby resolving a dependency of the receiving port error parameters on driving port error parameters.

In an embodiment of the present disclosure, the measurement circuits connected to the subsidiary ports are configured to adapt their respective measurement sensitivity in the second calibration mode. In an embodiment, the measurement circuits connected to the subsidiary ports may be controlled by the control circuit to adapt their respective measurement sensitivity in the second calibration mode.

For example, a respective amplification and/or a respective attenuation applied by the measurement circuits may be adapted.

According to another aspect of the present disclosure, the measurement circuits connected to the subsidiary ports are, for example, disconnected from the at least one signal generator circuit within the test and/or measurement instrument in the first sub-mode of the second calibration mode. In other words, in the first sub-mode of the second calibration mode, the test and/or measurement instrument may comprise no direct signal path between the at least one signal generator circuit and the subsidiary ports. Thus, the measurement circuits connected to the subsidiary ports receive the calibration signal only via a connection for example via an external connection, between the main port and the respective subsidiary port.

Likewise, the measurement circuit connected to the main port may be disconnected from the at least one signal generator circuit within the test and/or measurement instrument in the second sub-mode of the second calibration mode. Accordingly, the test and/or measurement instrument may comprise no direct signal path between the at least one signal generator circuit and the main port in the second sub-mode. Thus, the measurement circuit connected to the main port receives the calibration signal only via a connection for example via an external connection, between the corresponding subsidiary port and the main port.

A further aspect of the present disclosure provides, for example, that the measurement circuits each comprise a forward measuring receiver circuit and a backward measuring receiver circuit. Therein, at least in the first calibration mode, the forward measuring receiver circuit is configured to measure a forward travelling signal, i.e. a signal travelling from the signal generator circuit towards the respective port for example the calibration signal. The backward measuring receiver circuit is configured to measure a backward travelling signal, i.e. a signal travelling from the respective port towards the signal generator circuit.

In an embodiment of the present disclosure, the measurement circuits connected with the subsidiary ports are configured to measure the calibration signal received by the respective subsidiary port from the signal generator circuit via the main port by the forward measuring receiver circuit. In other words, instead of the backward measuring receiver circuit or in addition to the backward measuring receiver circuit, the forward measuring receiver circuit may be used to measure the calibration signal received by the respective subsidiary port from the main port in the first sub-mode of the second calibration mode.

In an embodiment, the test and/or measurement instrument may comprise at least one switching circuit, wherein the at least one switching circuit is configured to selectively connect the backward measuring receiver circuits and/or the forward measuring receiver circuits to the respective port.

The test and/or measurement instrument may be a vector network analyzer. However, it is to be understood that the test and/or measurement instrument may be established as any other suitable type of test and/or measurement instrument having at least three ports.

Embodiments of the present disclosure further provide a calibration method of calibrating a test and/or measurement instrument. The test and/or measurement instrument comprises at least three ports, at least three measurement circuits, at least one signal generator circuit, and a control circuit. Each of the at least three measurement circuits is connected with one of the at least three ports, respectively. In an embedment, the calibration method comprises the steps of setting, by the control circuit, a first calibration mode, wherein the measurement circuits are each configured to measure a calibration signal travelling from the signal generator circuit to the respective port as well as a signal traveling from the respective port to the signal generator circuit in the first calibration mode;

performing, in the first calibration mode, a set of calibration measurements on the at least three ports, thereby obtaining a first set of measurement data;

setting, by the control circuit, a second calibration mode, wherein the second calibration mode has a first sub-mode and a second sub-mode, wherein one of the at least three ports is a main port in the second calibration mode, wherein the remaining ports are subsidiary ports in the second calibration mode, wherein the measurement circuits connected with the subsidiary ports are configured to measure the calibration signal received by the respective port from the signal generator circuit via the main port in the first sub-mode, and wherein the measurement circuit connected with the main port is configured to measure the calibration signal received by the main port from the signal generator circuit via the subsidiary port in the second sub-mode;

connecting the subsidiary ports to the main port consecutively;

generating, by the signal generator circuit, the calibration signal;

forwarding the calibration signal to the main port in the first sub-mode;

measuring, for each subsidiary port connected to the main port, the calibration signal received by the respective port from the signal generator circuit via the main port;

forwarding the calibration signal to only one of the subsidiary ports in the second sub-mode; and measuring the calibration signal received by the main port from the signal generator circuit via the subsidiary port, thereby obtaining a second set of measurement data.

In an embodiment, the set of calibration measurements performed in the first calibration mode may be a minimal set of calibration measurements necessary.

In an embodiment, for each port, calibration measurements may be performed for at least three different calibration standards connected consecutively to the respective port for example for exactly three different calibration standards.

Further, calibration measurements may be performed for a set of connections between the at least three ports for example for a minimal set of connections, i.e. the minimum number of connections necessary.

In an embodiment, the minimal set of connections corresponds to a set of connections between the ports that allow to relate the calibration results of each port with each other port. For example, for three ports, performing calibration measurements for a connection between the first port and the second port as well as for a connection between the first port and the third port is sufficient, while no calibration measurement for a connection between the second port and the third port has to be performed.

In general, for n ports, the minimum number of connections necessary in the first calibration mode is n−1.

Any embodiment of the test and/or measurement instrument described above may be calibrated using any of the embodiments of the calibration method according to the present disclosure.

Regarding the further advantages and properties of the calibration method, reference is made to the explanations given above with respect to the test and/or measurement instrument, which also hold for the calibration method and vice versa.

According to an aspect of the present disclosure, error parameters, for example, are determined for all of the at least three ports based on the first set of measurement data and based on the second set of measurement data. In an embodiment, all error parameters necessary for fully calibrating the test and/or measurement instrument can be determined based on the first set of measurement data and based on the second set of measurement data, i.e. no further measurements are necessary.

According to another aspect of the present disclosure, operational parameters of the test and/or measurement instrument, for example, are adapted based on the error parameters determined. Accordingly, the test and/or measurement instrument may be calibrated based on the error parameters determined.

In an embodiment of the present disclosure, a respective measurement sensitivity of the measurement circuits connected to the subsidiary ports is adapted in the second calibration mode. In an embodiment, the measurement circuits connected to the subsidiary ports may be controlled by the control circuit to adapt their respective measurement sensitivity in the second calibration mode.

For example, a respective amplification and/or a respective attenuation applied by the measurement circuits may be adapted.

In a further embodiment of the present disclosure, the measurement circuits connected to the subsidiary ports are disconnected from the at least one signal generator circuit within the test and/or measurement instrument in the first sub-mode of the second calibration mode. In other words, in the first sub-mode of the second calibration mode, the test and/or measurement instrument comprises no direct signal path between the at least one signal generator circuit and the subsidiary ports. Thus, the measurement circuits connected to the subsidiary ports receive the calibration signal only via a connection, for example via an external connection, between the main port and the respective subsidiary port.

In an embodiment, the first set of measurement data may be obtained based on at least three different calibration standards and/or based on a set of connections between the at least three ports.

In an embodiment, the at least three different calibration standards may be connected consecutively to each of the ports, and a corresponding calibration measurement may be performed for each calibration standard connected.

For example, the at least three different calibration standards may comprise "open", "short", and "matched". However, any other suitable set of calibration standards may be used.

For the set of connections between the at least three ports, a further calibration standard, e.g. a "through" calibration standard, may be interconnected between the respective ports.

In an embodiment, the set of connections between the at least three ports may be a minimal set of connections, i.e. the minimum number of connections necessary in order to relate the calibration results of each port with each other port, as already described above.

An aspect of the present disclosure provides that the main port is the same one of the at least three ports for determining the whole second set of measurement data. In other words, the whole second set of measurement data may be determined with the same port being designated as main port. Accordingly, all remaining ports are connected consecutively to the same port being the main port in the second calibration method.

In an embodiment of the present disclosure, different ones of the at least three ports are selected as main port consecutively for determining the second set of measurement data. In other words, the second set of measurement data may be determined with different ports being designated as main port for different measurements. The number of calibration measurements necessary in this variant of the present disclosure is the same as for the variant, according to which the main port is the same one of the at least three ports for determining the whole second set of measurement data.

According to another aspect of the present disclosure, the measurement circuits each comprise a forward measuring receiver circuit and a backward measuring receiver circuit, wherein the calibration signal received by the respective subsidiary port from the signal generator circuit via the main port is measured by the forward measuring receiver circuit of the respective measurement circuit connected with the respective subsidiary port. Therein, at least in the first calibration mode, the forward measuring receiver circuit is configured to measure a forward travelling signal, i.e. a signal travelling from the signal generator circuit towards the respective port for example the calibration signal. The backward measuring receiver circuit is configured to measure a backward travelling signal, i.e. a signal travelling from the respective port towards the signal generator circuit. Instead of the backward measuring receiver circuit or in addition to the backward measuring receiver circuit, the forward measuring receiver circuit may be used to measure the calibration signal received by the respective subsidiary port in the first sub-mode of the second calibration mode.

In an embodiment, the measurement circuit connected to the main port may be disconnected from the at least one signal generator circuit within the test and/or measurement instrument in the second sub-mode of the second calibration mode. Accordingly, the test and/or measurement instrument may comprise no direct signal path between the at least one signal generator circuit and the main port in the second sub-mode. Thus, the measurement circuit connected to the main port receives the calibration signal only via a connection for example via an external connection, between the corresponding subsidiary port and the main port.

In an embodiment of the present disclosure, the test and/or measurement instrument is a vector network analyzer. However, it is to be understood that the test and/or measurement instrument may be established as any other suitable type of test and/or measurement instrument having at least three ports.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 3 shows an example of a flow chart of a calibration method according to an embodiment of the present disclosure;

FIG. 8 shows an example error model used for calibrating the test and/or measurement instrument of FIG. 1.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
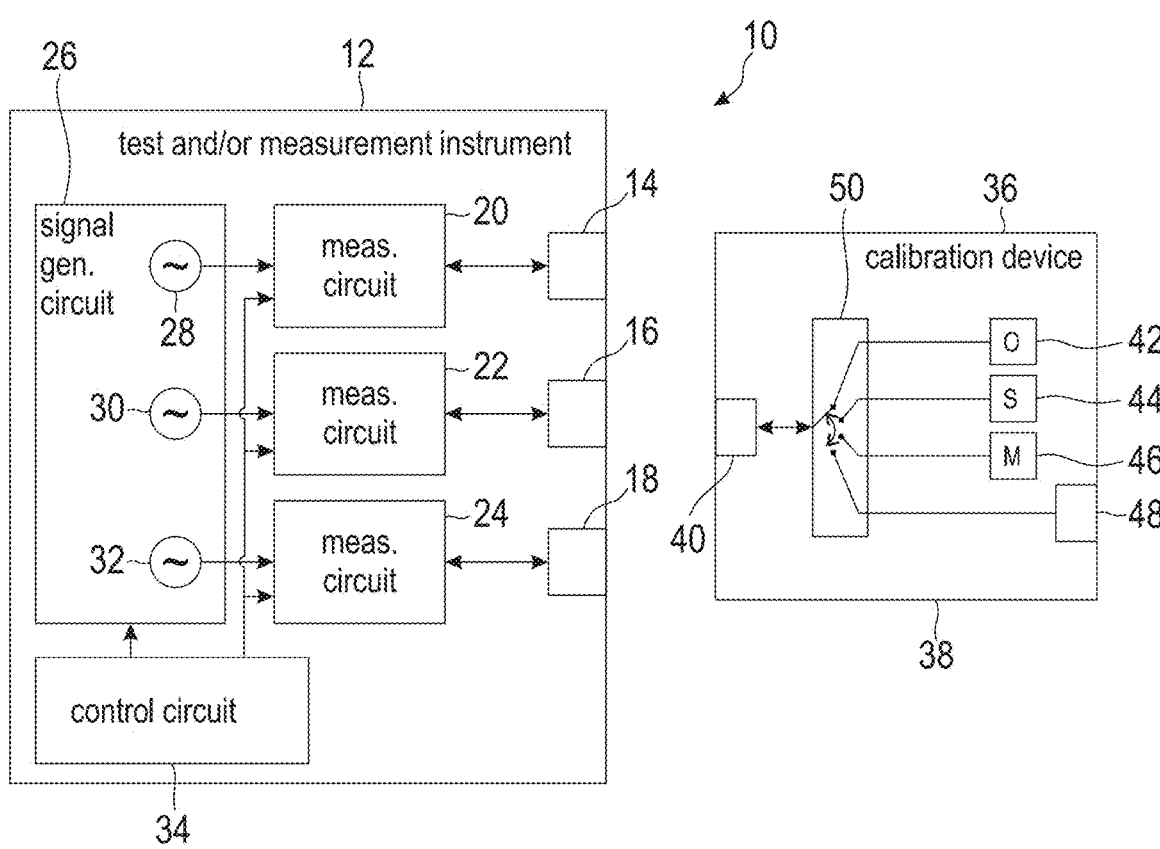
FIG. 1 schematically shows an example of a calibration system comprising a test and/or measurement instrument according to an embodiment of the present disclosure.

FIG. 1 schematically shows a calibration system 10 comprising a test and/or measurement instrument 12, wherein the calibration system 10 is configured to calibrate the test and/or measurement instrument 12. In general, the test and/or measurement instrument 12 is configured to perform tests and/or measurements on electronic devices under test.

For example, the test and/or measurement instrument 12 may be a vector network analyzer. However, it is to be understood that the test and/or measurement instrument 12 may be established as any other type of test and/or measurement instrument, e.g. as an oscilloscope, as a spectrum analyzer, or as a signal analyzer.

The test and/or measurement instrument 12 has at least three ports, wherein the at least three ports comprise a first port 14, a second port 16, and a third port 18. It is emphasized that the test and/or measurement instrument 12 may comprise more than three ports. However, without restriction of generality, the exemplary case of three ports is described hereinafter.

In the embodiment of FIG. 1, the test and/or measurement instrument 12 also comprises a first measurement circuit 20 that is connected to the first port 14, a second measurement circuit 22 that is connected to the second port 16, and a third measurement circuit 24 that is connected to the third port 18.

The test and/or measurement instrument 12 further comprises a signal generator circuit 26. In general, the signal generator circuit 26 is configured to generate and output a calibration signal to the at least three ports 14, 16, 18 via the respectively allocated measurement circuits 20, 22, 24. In other words, the calibration signal is forwarded to the first port 14 via the first measurement circuit 20, to the second port 16 via the second measurement circuit 22, and to the third port 18 via the third measurement circuit 24.

In the example embodiment shown in FIG. 1, the signal generator circuit 26 comprises a first signal generator sub-circuit 28 that is allocated to the first port 14, and that is configured to generate and output the calibration signal to the first port 14. The signal generator circuit 26 also comprises a second signal generator sub-circuit 30 that is allocated to the second port 16, and that is configured to generate and output the calibration signal to the second port 16. The signal generator circuit 26 further comprises a third signal generator sub-circuit 32 that is allocated to the third port 18, and that is configured to generate and output the calibration signal to the third port 18.

However, it is to be understood that the signal generator circuit 26 may comprise any other number of signal generator sub-circuits, for example only a single signal generator sub-circuit that is configured to generate and output the calibration signal to all of the ports 14, 16, 18.

The test and/or measurement instrument 12 further comprises a control circuit 34 that is connected to the signal generator circuit 26 as well as to the measurement circuits 20, 22, 24. In general, the control circuit 34 is configured to set operational parameters of the test and/or measurement instrument 12 for example operational parameters of the signal generator circuit 26 and/or operational parameters of the measurement circuits 20, 22, 24. The functionality of the control circuit 34 will be described in more detail below.

In the example embodiment shown in FIG. 1, the calibration system 10 further comprises a calibration device 36 that is provided separately from the test and/or measurement instrument 12. In an embodiment, the calibration device 36 comprises a housing 38 that is established separately from the test and/or measurement instrument 12, wherein the components described hereinafter are provided in the housing 38.

In an embodiment, the calibration device 36 comprises a connecting port 40 that is connectable to the first port 14, the second port 16, and/or the third port 18 of the test and/or measurement instrument 12 for example by a cable. The calibration device 36 also comprises a set of calibration standards, wherein the set of calibration standards comprises a first calibration standard 42, a second calibration standard 44, and a third calibration standard 46.

For example, the first calibration standard 42, the second calibration standard 44, and the third calibration standard 46 may correspond to "open" ("O"), "short" ("S"), and "matched" ("M") calibration standards, respectively. However, it is to be understood that the set of calibration standards may comprise other suitable types of calibration standards. Further, it is noted that the set of calibration standards may comprise more than three different calibration standards.

Optionally, the calibration device 36 may comprise a further connecting port 48.

In an embodiment, the calibration device 36 further comprises a switching circuit 50 that is connected to the connecting port 40 as well as to the calibration standards 42, 44, 46, and optionally to the further connecting port 48. The switching circuit 50 is configured to selectively connect one of the calibration standards 42, 44, 46, or the further connecting port 48 to the connecting port 40.

It is noted that the calibration device 36 according to any of the embodiments described above is optional. It is also possible to connect the individual calibration standards 42, 44, 46 to the test and/or measurement instrument 12 directly, i.e. directly via a cable.

Figure 2:
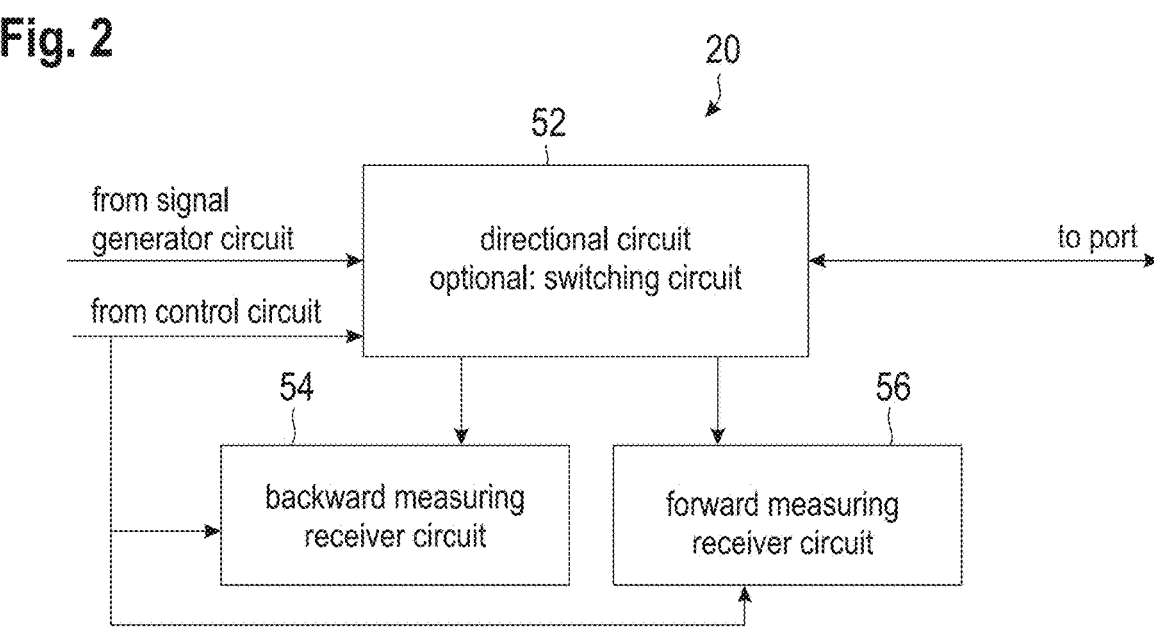
FIG. 2 schematically shows an example of a measurement circuit of a test and/or measurement instrument according to an embodiment of the present disclosure.

FIG. 2 shows an example of the first measurement circuit 20 in more detail, wherein it is to be understood that the second measurement circuit 22 and the third measurement circuit 24 may be established similarly or identically to the first measurement circuit 20. As shown in FIG. 2, the first measurement circuit 20 comprises a directional circuit 52, a backward measuring receiver circuit 54, and a forward measuring receiver circuit 56.

As will be described in more detail below, the control circuit 34 is configured to set different calibration modes of the test and/or measurement instrument 12. Depending on the set calibration mode, the directional circuit 52 may be configured to transmit a forward travelling signal, i.e. a signal travelling from the signal generator circuit 26 towards the first port 14, to the forward measuring receiver circuit 56 and to the first port 14. Further, depending on the set calibration mode, the directional calibration circuit 52 may be configured to transmit a backward travelling signal, i.e. a signal travelling from the first port 14 towards the signal generator circuit 26, to the backward measuring receiver circuit 54 and/or to the forward measuring receiver circuit 56.

In an embodiment, the first measurement circuit 20 may comprise a switching circuit, wherein the switching circuit is configured to selectively connect the backward measuring receiver circuit 54 and/or the forward measuring receiver circuit 56 to the first port 14.

An example of a calibration method of calibrating the test and/or measurement instrument 12 will now be described with reference to FIG. 3.

The test and/or measurement instrument 12 described above is provided (step S1). Optionally, the calibration device 36 described above is provided (step S2).

A first calibration mode is set by the control circuit 34, wherein the measurement circuits 20, 22, 24 are each configured to measure the calibration signal travelling from the signal generator circuit 26 towards the respective port 14, 16, 18, as well as a signal traveling from the respective port 14, 16, 18 towards the signal generator circuit 26 in the first calibration mode (step S3).

Figure 4:
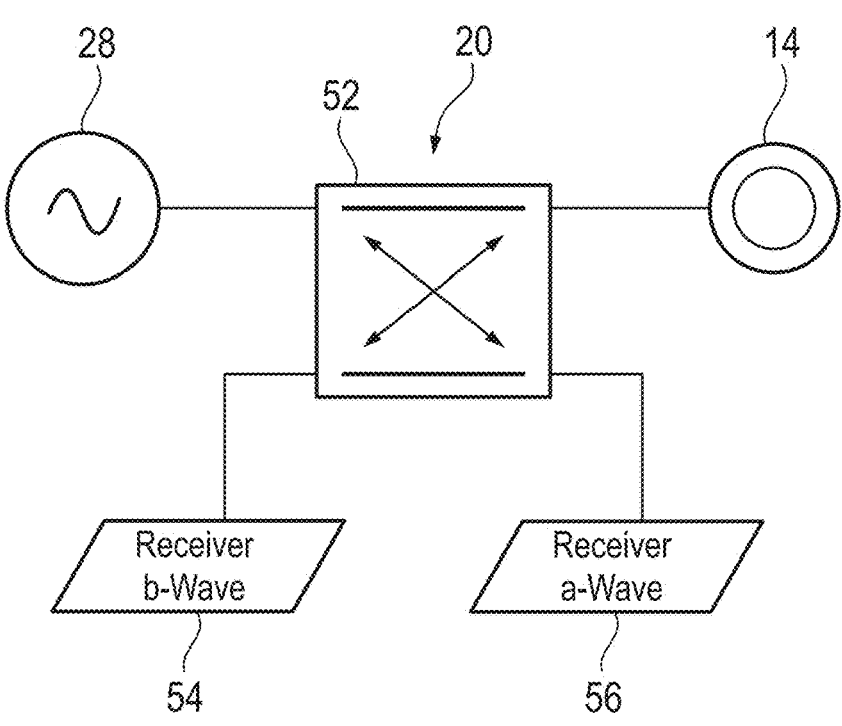
FIG. 4 schematically shows a first configuration of the measurement circuit of FIG. 2.

An example embodiment of the first measurement circuit 20 in the first calibration mode is illustrated in FIG. 4, wherein it is to be understood that the second measurement circuit 22 and the third measurement circuit 24 may be established similarly or identically to the first measurement circuit 20 in the first calibration mode.

In the first calibration mode, the directional circuit 52 forwards the calibration signal to the forward measuring receiver circuit 56 as well as to the respective port 14, 16, 18. Accordingly, the forward measuring receiver circuit 56 measures the calibration signal travelling towards the respective port 14, 16, 18. Moreover, the directional circuit 52 forwards the signal traveling from the respective port 14, 16, 18 towards the signal generator circuit 26 to the backward measuring receiver circuit 54, i.e. the backward measuring receiver circuit 54 measures the backward travelling signal.

The backward travelling signal may be a reflected signal that is reflected at the respective port 14, 16, 18 and/or at a device connected to the respective port 14, 16, 18. Alternatively or additionally, the backward travelling signal may be the calibration signal received by the respective port 14, 16, 18 via an external connection to another one of the ports 14, 16, 18.

A set of calibration measurements is performed in the first calibration mode, thereby obtaining a first set of measurement data (step S4). In an embodiment, the set of calibration measurements comprises the following measurements.

For each port 14, 16, 18, the calibration standards 42, 44, 46 are consecutively connected to the respective port 14, 16, 18. For each calibration standard 42, 44, 46 connected, the calibration signal is generated by the signal generator circuit 26, the forward travelling signal (i.e. the calibration signal) is measured by the forward measuring receiver circuit 56 connected to the respective port 14, 16, 18, and the backward travelling signal is measured by the backward measuring receiver circuit 54 connected to the respective port 14, 16, 18.

The calibration standards 42, 44, 46 may be connected to the respective port 14, 16, 18 by connecting the connecting port 40 to the respective port 14, 16, 18 via a cable, and by setting the switching circuit 50 appropriately. Further, measurements are performed for a set of connections between the ports 14, 16, 18, namely for a minimal set of connections that allows to relate the calibration results of each port 14, 16, 18 with each other port 14, 16, 18. Therein, an additional calibration standard may be interconnected between the connected ports, e.g. a "through" calibration standard.

In the example embodiment shown in FIG. 1, the first port 14 may be connected to the second port 16. The calibration signal is generated by the first signal generator sub-circuit 28, the forward travelling signal (i.e. the calibration signal) is measured by the forward measuring receiver circuit 56 of the first measurement circuit 20, the backward travelling signal is measured by the backward measuring receiver circuit 54 of the first measurement circuit 20, the calibration signal received by the second port 16 from the first port 14 is measured by the backward measuring receiver circuit 54 of the second measurement circuit 22, and a reflected signal caused by a non-ideal termination is measured by the forward measuring receiver circuit 56 of the second measurement circuit 22.

Then, the calibration signal is generated by the second signal generator sub-circuit 30, the forward travelling signal (i.e. the calibration signal) is measured by the forward measuring receiver circuit 56 of the second measurement circuit 22, the backward travelling signal is measured by the backward measuring receiver circuit 54 of the second measurement circuit 22, the calibration signal received by the first port 14 from the second port 16 is measured by the backward measuring receiver circuit 54 of the first measurement circuit 20, and a reflected signal caused by a non-ideal termination is measured by the forward measuring receiver circuit 56 of the first measurement circuit 20.

These measurements are then repeated for a connection between the first port 14 and the third port 18. Repeating these measurements for a connection between the second port 16 and the third port 18 is not necessary.

The ports 14, 16, 18 may be connected to each other directly via a cable. Alternatively, the ports 14, 16, 18 may be connected to each other by connecting one of the ports 14 to the connecting port 40, connecting another one of the ports 14, 16, 18 to the further connecting port 48, and setting the switching circuit 50 to connect the connecting port 40 with the further connecting port 48.

In an embodiment, the second calibration mode may be set by the control circuit 34, wherein one of the ports 14, 16, 18 is a main port in the second calibration mode, and wherein the remaining ports 14, 16, 18 are subsidiary ports in the second calibration mode (step S5).

Without restriction of generality, the example case of the first port 14 being the main port is described hereinafter, i.e. the second port 16 and the third port 18 are a subsidiary port, respectively.

In general, the second calibration mode has a first sub-mode and a second sub-mode. In the first sub-mode of the second calibration mode, the control circuit 34 controls the directional circuits 52 connected to the subsidiary ports, i.e. to the second port 16 and to the third port 18, to disconnect the signal generator circuit 26 from the respective measurement circuit 22, 24 and thus from the respective port 16, 18.

In other words, in the first sub-mode of the second calibration mode, there may be no direct signal path between the signal generator circuit 26 and the subsidiary ports within the test and/or measurement instrument 12.

Further, in the first sub-mode, the control circuit 34 may control the directional circuits 52 connected to the subsidiary ports to connect the respective forward measuring receiver circuit 56 to the respective subsidiary port, such that the forward measuring receiver circuit 56 measures a backward travelling signal received by the respective subsidiary port.

In an embodiment, the backward measuring receiver circuits 54 may remain connected to subsidiary ports, such that the backward travelling signal is measured by both the backward measuring receiver circuit 54 and the forward measuring receiver circuit 56.

Figure 5:
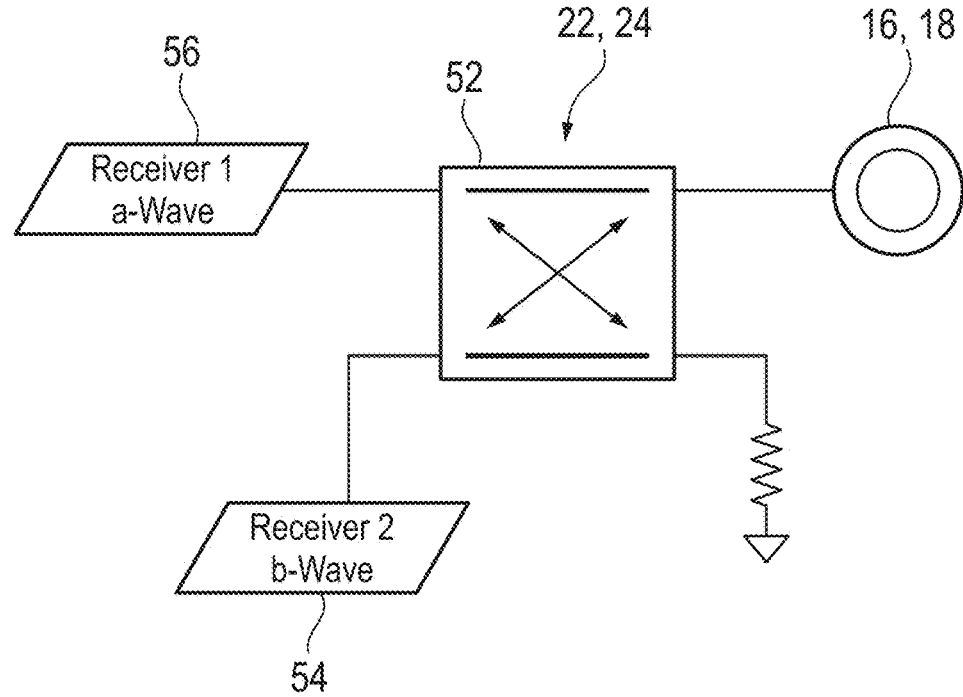
FIG. 5 schematically shows a second configuration of the measurement circuit of FIG. 2.

A first example embodiment of the measurement circuits 22, 24 connected to the subsidiary ports, i.e. to the second port 16 and to the third port 18, in the first sub-mode is illustrated in FIG. 5. A second example embodiment of the measurement circuits 22, 24 connected to the subsidiary ports in the first sub-mode is illustrated in FIG. 6.

Figure 6:
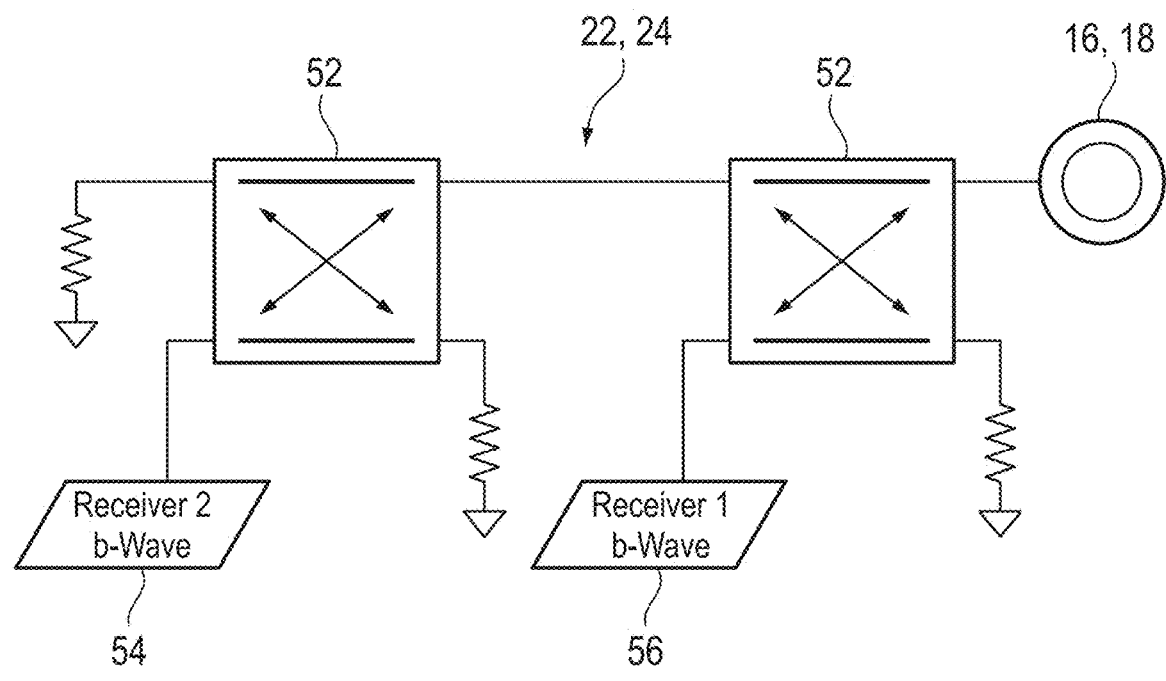
FIG. 6 schematically shows a third configuration of the measurement circuit of FIG. 2.

In the example embodiment of FIG. 6, a portion of the directional circuit 52 connecting the backward measuring receiver 54 to the subsidiary port may have different electromagnetic properties than a portion of the directional circuit 52 connecting the forward measuring receiver 56 to the subsidiary port. For example, different attenuations may be provided by the portion of the directional circuit 52 connecting the backward measuring receiver 54 to the subsidiary port and the portion of the directional circuit 52 connecting the forward measuring receiver 56 to the subsidiary port. In other words, the calibration signal may be forwarded to the backward measuring receiver 54 and to the forward measuring receiver 56 with different attenuations.

In an embodiment, the control circuit 34 may control the backward measuring receiver circuits 54 and/or the forward measuring receiver circuits 56 to adapt their respective measurement sensitivity in the second calibration mode. For example, a respective amplification and/or a respective attenuation may be adapted.

The subsidiary ports are connected to the main port consecutively, and at least one calibration measurement is performed for each subsidiary port connected to the main port, thereby obtaining a second set of measurement data (step S6).

In the example described above, the second port 16 may be connected to the first port 14 in the second calibration mode.

In the first sub-mode of the second calibration mode, a calibration signal is generated by the first signal generator sub-circuit 28 and forwarded to the second port 16 via the first measurement circuit 20 and the first port 14. The forward travelling signal (i.e. the calibration signal) is measured by the forward measuring receiver circuit 56 of the first measurement circuit 20. A reflected signal is measured by the backward measuring receiver circuit 54 of the first measurement circuit 20.

The signal received by the second port 16 from the first port 14 is measured by the forward measuring receiver circuit 56 of the second measurement circuit 22. The signal received by the second port 16 from the first port 14 may further be measured by the backward measuring receiver circuit 54 of the second measurement circuit 22. Afterwards, the third port 18 is connected to the first port 14, and the measurements described above are repeated.

For only one of the subsidiary ports, a further measurement is performed in the second sub-mode of the second calibration mode. Without restriction of generality, the example case is described hereinafter in which the further measurement is performed for the second port 16. In the second sub-mode, the subsidiary port, i.e. the second port 16, is the driving port, while the main port, i.e. the first port 14, is the receiving port.

In an embodiment, the control circuit 34 controls the directional circuit 52 connected to the main port to disconnect the signal generator circuit 26 from the first measurement circuit 20 and thus from the main port. In other words, in the second sub-mode of the second calibration mode, there may be no direct signal path between the signal generator circuit 26 and the main port within the test and/or measurement instrument 12.

Further, in the second sub-mode, the control circuit 34 controls the directional circuit 52 connected to the main port to connect the forward measuring receiver circuit 56 to the main port, such that the forward measuring receiver circuit 56 measures a backward travelling signal received by the main port.

In an embodiment, the backward measuring receiver circuit 54 may remain connected to main port, such that the backward travelling signal is measured by both the backward measuring receiver circuit 54 and the forward measuring receiver circuit 56. Further, in the second sub-mode, the control circuit 34 may control the second measurement circuit 22 to be operated in the configuration of the first operational mode described above.

In the second sub-mode of the second calibration mode, a calibration signal is generated by the second signal generator sub-circuit 30 and forwarded to the first port 14 via the second measurement circuit 22 and the second port 16. The forward travelling signal (i.e. the calibration signal) is measured by the forward measuring receiver circuit 56 of the second measurement circuit 22. A reflected signal is measured by the backward measuring receiver circuit 54 of the second measurement circuit 22.

The signal received by the first port 14 from the second port 16 is measured by the forward measuring receiver circuit 56 of the first measurement circuit 20. The signal received by the first port 14 from the second port 16 may further be measured by the backward measuring receiver circuit 54 of the first measurement circuit 20.

Figure 7:
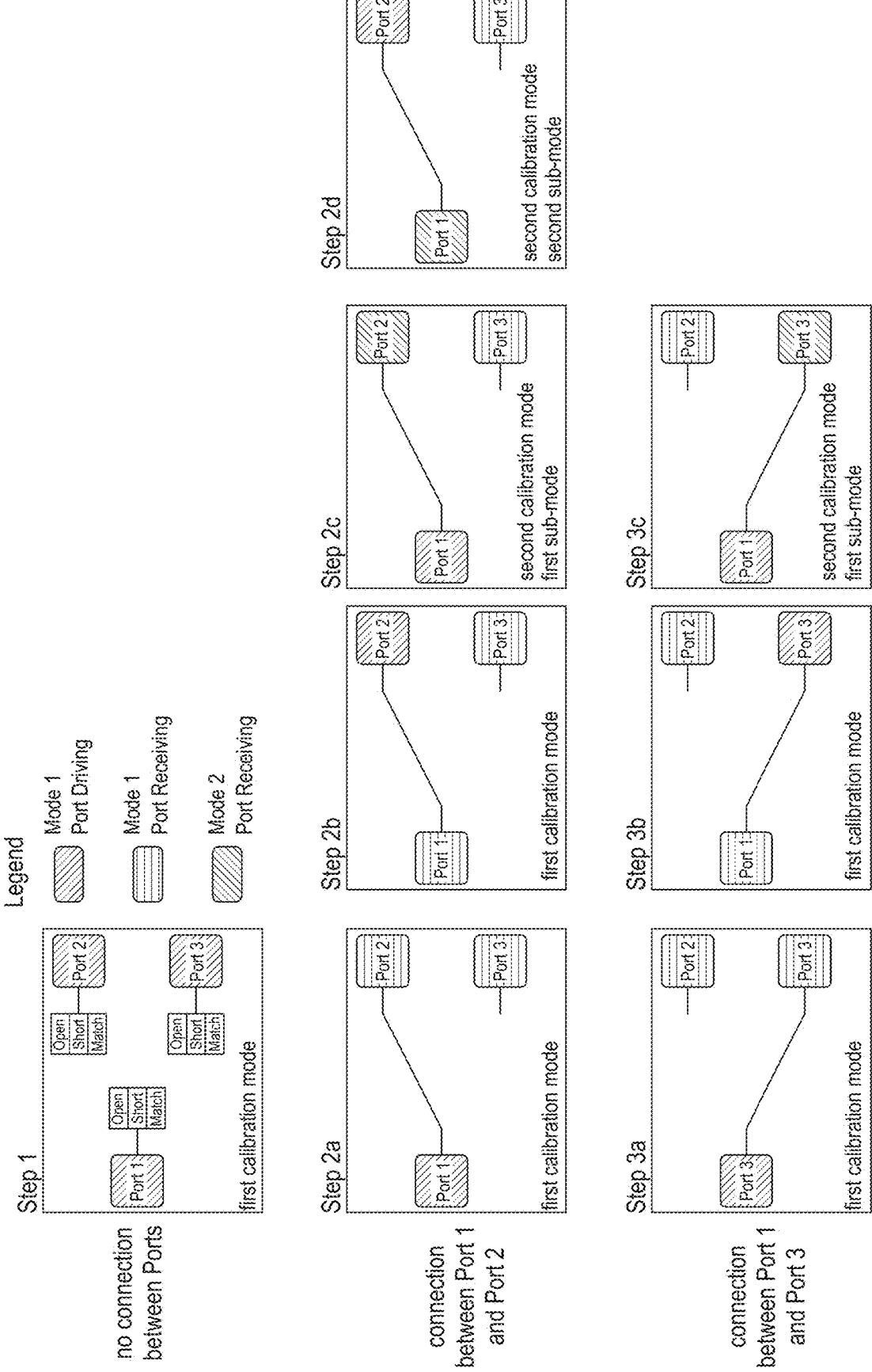
FIG. 7 schematically shows an overview of calibration measurements performed in the calibration method according to an embodiment of the present disclosure.

An overview of the measurements described above is shown in FIG. 7. It is noted that in the example case described above, the first port 14 remains the main port for all measurements conducted in the second calibration mode. However, it is also possible that different ones of the ports 14, 16, 18 are selected as main port consecutively for determining the second set of measurement data. For example, the first port 14 may be the main port for the first measurement, as described above. Afterwards, the second port 16 may be connected to the third port 18, and the second port 16 may be selected as main port.

Error parameters are determined by the control circuit 34 for all of the ports 14, 16, 18 based on the first set of measurement data and based on the second set of measurement data (step S7).

An example error model for the ports 14, 16, 18 is illustrated in FIG. 8. The left hand side of FIG. 8 shows a portion of the error model describing a driving port, i.e. the port receiving the calibration signal form the signal generator circuit 26 directly. In the particular example shown in FIG. 8, the first port 14 is the driving port.

The right hand side of FIG. 8 shows a portion of the error model describing a receiving port, i.e. the port receiving the calibration signal via another port. In the particular example shown in FIG. 8, the second port 16 is the receiving port.

In an embodiment, the driving port is described by a Q-matrix that is given by $$Q = \begin{pmatrix} \mathcal{F} - \dfrac{\mathcal{D}\mathcal{S}}{\mathcal{R}} & \dfrac{\mathcal{S}}{\mathcal{R}} \\ -\dfrac{\mathcal{D}}{\mathcal{R}} & \dfrac{1}{\mathcal{R}} \end{pmatrix}.$$

The receiving port is described by an L-matrix that is given by $$L = \begin{pmatrix} \dfrac{\mathcal{L}}{\mathcal{T}} \\ \dfrac{1}{\mathcal{T}} \end{pmatrix}.$$

The error parameters of the error model comprise a forward tracking term of port x ($\mathcal{F}_x$), a directivity of port x ($\mathcal{D}_x$), a reflection tracking term of port x ($\mathcal{R}_x$), a source match of port x ($\mathcal{S}_x$), a load match of port x ($\mathcal{L}_x$), a transmission tracking of port x ($\mathcal{T}_x$).

The error parameters relate raw measurement waves ($\hat{a}_x$, $\hat{b}_x$) to corrected measurement waves ($a_x$, $b_x$).

Therein, "x" represents the first port 14, the second port 16, or the third port 18.

A relation between the raw measurement waves and the corrected measurement waves is given by $$\begin{pmatrix} a \\ b \end{pmatrix} = Q \cdot \begin{pmatrix} \hat{a} \\ \hat{b} \end{pmatrix}$$

$$\begin{pmatrix} a \\ b \end{pmatrix} = L \cdot \hat{b}$$

In order to resolve a dependency of the receiving port error parameters on the driving port error parameters, relative power levels $$p_{rel}^{Qx}$$

of the driving ports are determined according to $$P_{rel}^{Q2} = P_{rel}^{Q1} \frac{\det(Q^{P1})}{l_2^{P1D2} \cdot q_{11}^{P1} - l_1^{P1D2} \cdot q_{21}^{P1}}$$

With the knowledge of $$p_{rel}^{Qx}$$

it is no longer necessary to measure all possible connections between the ports 14, 16, 18, since applying $$p_{rel}^{Qx}$$

to the error parameters resolves any ambiguity.

For example, $L^{P2D1}$ for the first port 14 being the driving port is not necessarily equal to $L^{P2D3}$ for the third port 18 being the driving port, even though it describes the physically same receiving port, namely the second port 16.

However, $$L^{P2D1} \cdot p_{rel}^{Q1} \text{ and } L^{P2D3} \cdot p_{rel}^{Q3}$$

are equal. Therefore, if the connection between the first port 14 and the second port 16 was already measured it is not necessary to measure the connection from the second port 16 to the third port 18.

In an embodiment, Q, L, and $p_{rel}$ of the ports 14, 16, 18 may be determined for the first calibration mode based on the first set of measurement data.

Further, L may be determined for the second calibration mode based on the second set of measurement data with the knowledge of Q and $p_{rel}$ determined based on the first set of measurement data. Q and $p_{rel}$ do not change between the first calibration mode and the second calibration mode as they depend only on driving port characteristics and these are not changed between the two calibration modes.

Operational parameters of the test and/or measurement instrument 12 are adapted by the control circuit 34 based on the error parameters determined (step S8). In other words, the test and/or measurement instrument 12 is calibrated based on the error parameters determined.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiments, these components, or parts thereof, may be grouped in a single location or distributed over a wide area. In circumstances where the components are distributed, the components are accessible to each other via communication links.

In an embodiments, one or more of the components of the test and/or measurement instrument 12, the calibration device 36, etc., referenced above include circuitry programmed to carry out one or more steps of any of the methods disclosed herein. In an embodiment, one or more computer-readable media associated with or accessible by such circuitry contains computer readable instructions embodied thereon that, when executed by such circuitry, cause the component or circuity to perform one or more steps of any of the methods disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuity disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and/or measurement instrument, the test and/or measurement instrument, comprising:

at least three ports, wherein each of the at least three ports is configured to be connected to an external electronic device;

at least three measurement circuits, wherein each of the at least three measurement circuits is connected with one of the at least three ports, respectively;

at least one signal generator circuit, wherein the at least one signal generator circuit is configured to generate a calibration signal; and a control circuit;

wherein the control circuit is configured to set a first calibration mode of the test and/or measurement instrument, wherein the at least one signal generator circuit is configured to generate the calibration signal and to forward the calibration signal to the at least three ports simultaneously or consecutively in the first calibration mode, and wherein the measurement circuits are each configured to measure the calibration signal travelling from the signal generator circuit to the respective port as well as a signal traveling from the respective port to the signal generator circuit in the first calibration mode, thereby obtaining a first set of measurement data, wherein the control circuit is configured to set a second calibration mode of the test and/or measurement instrument, wherein one of the at least three ports is a main port, wherein the remaining ports are subsidiary ports in the second calibration mode, and wherein the second calibration mode has a first sub-mode and a second sub-mode, and wherein the at least one signal generator circuit is configured to generate the calibration signal and to forward the calibration signal only to the main port in the first sub-mode, wherein the measurement circuits connected with the subsidiary ports are, in the first sub-mode, configured to measure the calibration signal outputted by the main port and received by the respective subsidiary port from the signal generator circuit via the main port and a cable or a calibration device connecting the main port to the respective subsidiary port, and wherein the at least one signal generator circuit is configured to generate the calibration signal and to forward the calibration signal to only one of the subsidiary ports in the second sub-mode, wherein the measurement circuit connected with the main port is, in the second sub-mode, configured to measure the calibration signal outputted by the subsidiary port and received by the main port from the signal generator circuit via the subsidiary port and the cable or calibration device connecting the main port to the subsidiary port, thereby obtaining a second set of measurement data.

2. The test and/or measurement instrument of claim 1, wherein the control circuit is configured to determine error parameters for all of the at least three ports based on the first set of measurement data and based on the second set of measurement data.

3. The test and/or measurement instrument of claim 2, wherein the control circuit is configured to adapt operational parameters of the test and/or measurement instrument based on the error parameters determined.

4. The test and/or measurement instrument of claim 1, wherein the control circuit is configured to determine relative power levels of driving ports and/or driving port error parameters based on the first set of measurement data.

5. The test and/or measurement instrument of claim 4, wherein the control circuit is configured to determine error parameters for all of the at least three ports based on the first set of measurement data and based on the second set of measurement data, and wherein the control circuit is configured to apply the relative power levels determined to the error parameters.

6. The test and/or measurement instrument of claim 1, wherein the measurement circuits connected to the subsidiary ports are configured to adapt their respective measurement sensitivity in the second calibration mode.

7. The test and/or measurement instrument of claim 1, wherein the measurement circuits connected to the subsidiary ports are disconnected from the at least one signal generator circuit within the test and/or measurement instrument in the first sub-mode of the second calibration mode.

8. The test and/or measurement instrument of claim 1, wherein the measurement circuits each comprise a forward measuring receiver circuit and a backward measuring receiver circuit.

9. The test and/or measurement instrument of claim 8, wherein the measurement circuits connected with the subsidiary ports are configured to measure the calibration signal received by the respective subsidiary port from the signal generator circuit via the main port by the forward measuring receiver circuit.

10. The test and/or measurement instrument of claim 8, further comprising at least one switching circuit, wherein the at least one switching circuit is configured to selectively connect the backward measuring receiver circuits and/or the forward measuring receiver circuits to the respective port.

11. The test and/or measurement instrument of claim 1, wherein the test and/or measurement instrument is a vector network analyzer.

12. A calibration method of calibrating a test and/or measurement instrument, wherein the test and/or measurement instrument comprises at least three ports, at least three measurement circuits, at least one signal generator circuit, and a control circuit, wherein each of the at least three measurement circuits is connected with one of the at least three ports, respectively, the calibration method comprising:

setting, by the control circuit, a first calibration mode, wherein the measurement circuits are each configured to measure a calibration signal travelling from the signal generator circuit to the respective port as well as a signal traveling from the respective port to the signal generator circuit in the first calibration mode;

performing, in the first calibration mode, a set of calibration measurements on the at least three ports, thereby obtaining a first set of measurement data;

setting, by the control circuit, a second calibration mode, wherein the second calibration mode has a first sub-mode and a second sub-mode, wherein one of the at least three ports is a main port in the second calibration mode, wherein the remaining ports are subsidiary ports in the second calibration mode, wherein the measurement circuits connected with the subsidiary ports are, in the first sub-mode, configured to measure the calibration signal outputted by the main port and received by the respective subsidiary port from the signal generator circuit via the main port and a cable or a calibration device connecting the main port to the respective subsidiary port, and wherein the measurement circuit connected with the main port is, in the second sub-mode, configured to measure the calibration signal outputted by the subsidiary port and received by the main port from the signal generator circuit via the subsidiary port and the cable or calibration device connecting the main port to the subsidiary port;

connecting the subsidiary ports to the main port consecutively;

generating, by the signal generator circuit, the calibration signal;

forwarding the calibration signal to the main port in the first sub-mode;

measuring, for each subsidiary port connected to the main port, the calibration signal received by the respective subsidiary port from the signal generator circuit via the main port and the cable or calibration device connecting the main port to the respective subsidiary port;

forwarding the calibration signal to only one of the subsidiary ports in the second sub-mode; and measuring the calibration signal received by the main port from the signal generator circuit via the subsidiary port and the cable or calibration device connecting the main port to the subsidiary port, thereby obtaining a second set of measurement data.

13. The calibration method of claim 12, wherein error parameters are determined for all of the at least three ports based on the first set of measurement data and based on the second set of measurement data.

14. The calibration method of claim 13, wherein operational parameters of the test and/or measurement instrument are adapted based on the error parameters determined.

15. The calibration method of claim 12, wherein a respective measurement sensitivity of the measurement circuits connected to the subsidiary ports is adapted in the second calibration mode.

16. The calibration method of claim 12, wherein the measurement circuits connected to the subsidiary ports are disconnected from the at least one signal generator circuit within the test and/or measurement instrument in the first sub-mode of the second calibration mode.

17. The calibration method of claim 12, wherein the first set of measurement data is obtained based on at least three different calibration standards and/or based on a set of connections between the at least three ports.

18. The calibration method of claim 12, wherein the main port is the same one of the at least three ports for determining the whole second set of measurement data.

19. The calibration method of claim 12, wherein different ones of the at least three ports are selected as main port consecutively for determining the second set of measurement data.

20. The calibration method of claim 12, wherein the measurement circuits each comprise a forward measuring receiver circuit and a backward measuring receiver circuit, and wherein the calibration signal received by the respective subsidiary port from the signal generator circuit via the main port is measured by the forward measuring receiver circuit of the respective measurement circuit connected with the respective subsidiary port.

21. The calibration method of claim 12, wherein the measurement circuit connected to the main port is disconnected from the at least one signal generator circuit within the test and/or measurement instrument in the second sub-mode of the second calibration mode.

22. The calibration method of claim 12, wherein the test and/or measurement instrument is a vector network analyzer.

* * * * *